United States Patent [19]

Ecklund

[11] Patent Number: 5,109,542
[45] Date of Patent: Apr. 28, 1992

[54] AM-FM COMBINED STEREO RECEIVER

[75] Inventor: Lawrence M. Ecklund, Wheaton, Ill.

[73] Assignee: Motorola, Inc., Schaumburg, Ill.

[21] Appl. No.: 652,342

[22] Filed: Feb. 6, 1991

[51] Int. Cl.⁵ .................................. H04H 5/00
[52] U.S. Cl. ............................ 455/142; 381/7; 455/214
[58] Field of Search ................ 455/132, 142–144, 455/214; 381/2, 7, 13

[56] References Cited

U.S. PATENT DOCUMENTS

| | | | |
|---|---|---|---|
| 3,472,967 | 10/1969 | Wofford et al. | 455/142 |
| 3,665,507 | 5/1972 | Peil | 455/142 |
| 4,435,618 | 3/1984 | Fujishima | 381/7 |
| 4,821,322 | 4/1989 | Bose | 381/13 |
| 5,014,316 | 5/1991 | Mariah et al. | 381/7 |

*Primary Examiner*—Curtis Kuntz
*Attorney, Agent, or Firm*—Wayne J. Egan

[57] ABSTRACT

An improved AM-FM combined stereo receiver is provided having a single processor for removing, in the FM mode, arctangent distortion, and in the AM mode, to process the phase term from arctangent $$\left\{ \frac{L-R}{1+L+R} \right\}$$

to determine $$\left\{ \frac{L-R}{1+L+R} \right\}.$$

Further, the radio includes a single discriminator circuit, wherein, in the FM mode, the discriminator tank circuit is used to convert frequency deviation to baseband audio, and in the AM mode, the discriminator tank circuit is used as the frequency-determining element for the voltage controlled oscillator (VCO), the VCO being used to translate the intermediate frequency (IF) signal to baseband.

11 Claims, 3 Drawing Sheets

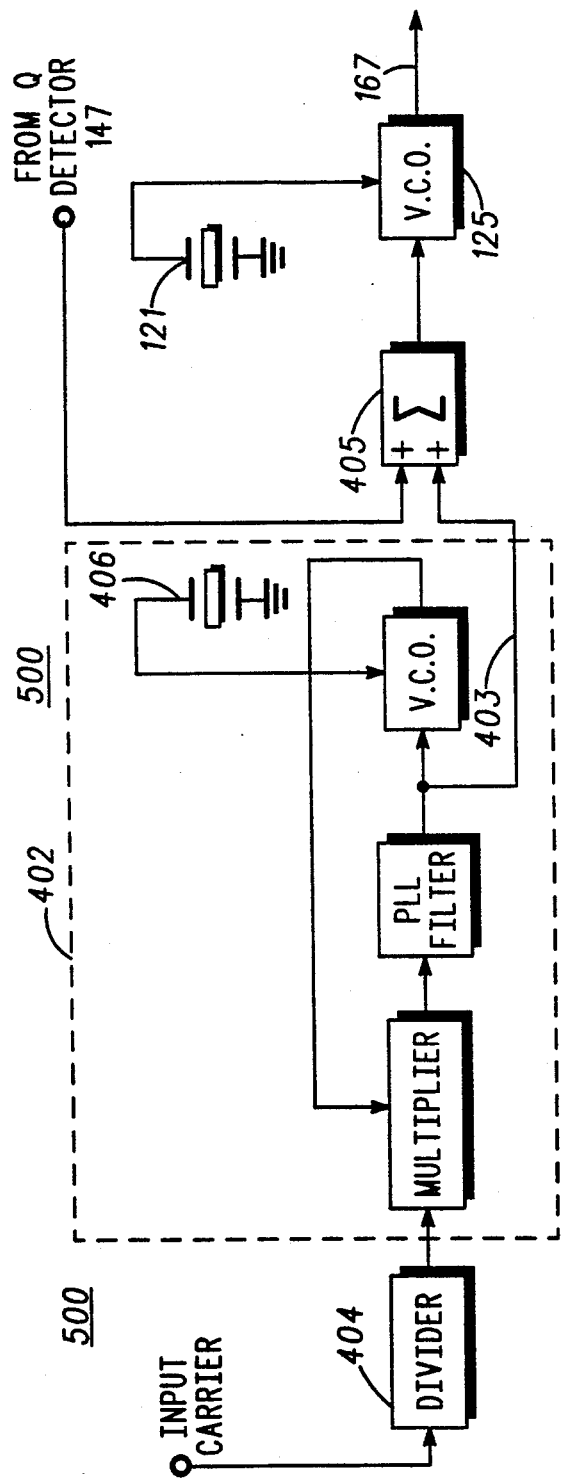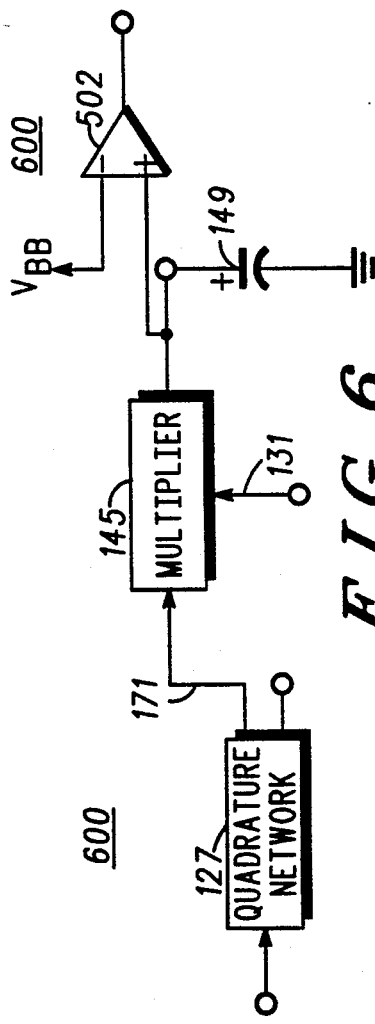

AM-FM COMBINED STEREO RECEIVER

TECHNICAL FIELD

This application relates to AM/FM receivers.

BACKGROUND OF THE INVENTION

This invention relates to the field of AM and FM receivers and more particularly to those receivers which are capable of receiving both AM stereo and FM stereo. The present invention addresses a method of minimizing the components used to create this system and therefore the cost and size of implementing said system. This minimization of size and cost is necessary for AM Stereo to be enjoyed by the maximum amount of radio listeners.

In March of 1982 the FCC adopted its unique Report and Order authorizing the so-called "market-place approach" to the selection of a standard for broadcast of stereophonic program material in the AM band. At the beginning of the marketplace competition there were five competing systems. Over the past eight years the number of competitors has been reduced to two. Of these the C-Quam® system enjoys a preponderant advantage in the number of stations and has recently been declared the De Facto standard by the FCC. Over the period of this competition there has been significant research and development in attempting to build AM Stereo decoders that were capable of recognizing the different stereo broadcasting systems and decoding them. Several of these approaches were supplied by IC manufactures to various receiver manufactures in hopes that they would use them in their radios. However over the resulting years very few receivers have used these IC's. The perceived major cause for the very limited usage of these circuits is their expensive cost and relatively poor performance when compared to the single system IC designed for the Motorola system. The development of this single system IC was completed by Motorola in 1982 and over 20 million parts were sold by the 4th quarter of 1990. However, it has been observed by the inventor and others that this part is used almost totally by the automative companies in their premium radio lines. This deprived the average listener of the pleasure and distant coverage benefits of AM Stereo.

The inventor determined that the best way to allow the benefits of AM Stereo to be enjoyed by a greater number of people was to reduce the cost without significantly lowering the performance of the receiver. Since the basic environment of the AM stereo receiver generally includes the FM stereo receiver, it was concluded that the best way to perform this goal was to design the AM stereo system to reuse as much of the FM stereo circuitry as possible. The present invention covers the switching and partitioning of circuitry to accomplish this goal.

SUMMARY OF THE INVENTION

It is an object of the invention to provide an improved, that is a lower cost, AM-FM combined stereo receiver. Accordingly, an improved AM-FM combined stereo receiver is provided having a single processor for removing, in the FM mode, arctangent distortion, and in the AM mode, to process the phase term from arctangent $$\left( \frac{L-R}{1+L+R} \right)$$

to determine $$\left( \frac{L-R}{1+L+R} \right)$$

Further, the radio includes a single discriminator circuit wherein, in the FM mode, the discriminator tank circuit is used to convert the frequency deviation to baseband audio and, in the AM mode, the discriminator tank circuit is used as the frequency-determining element for the voltage controlled oscillator (VCO), the VCO being used to translate the intermediate frequency (IF) signal to baseband. Further still, a single pilot tone circuit is shown which detects either the AM pilot tone or FM pilot tone and in the FM case supplies a reference signal to the FM decoder to translate the L−R to baseband.

BRIEF DESCRIPTION OF THE DRAWINGS

FIG. 5 is an expanded block diagram of the pilot tone VCO.

FIG. 6 is a block diagram of the pilot tone threshold circuit.

DETAILED DESCRIPTION OF THE INVENTION

Figure 1:
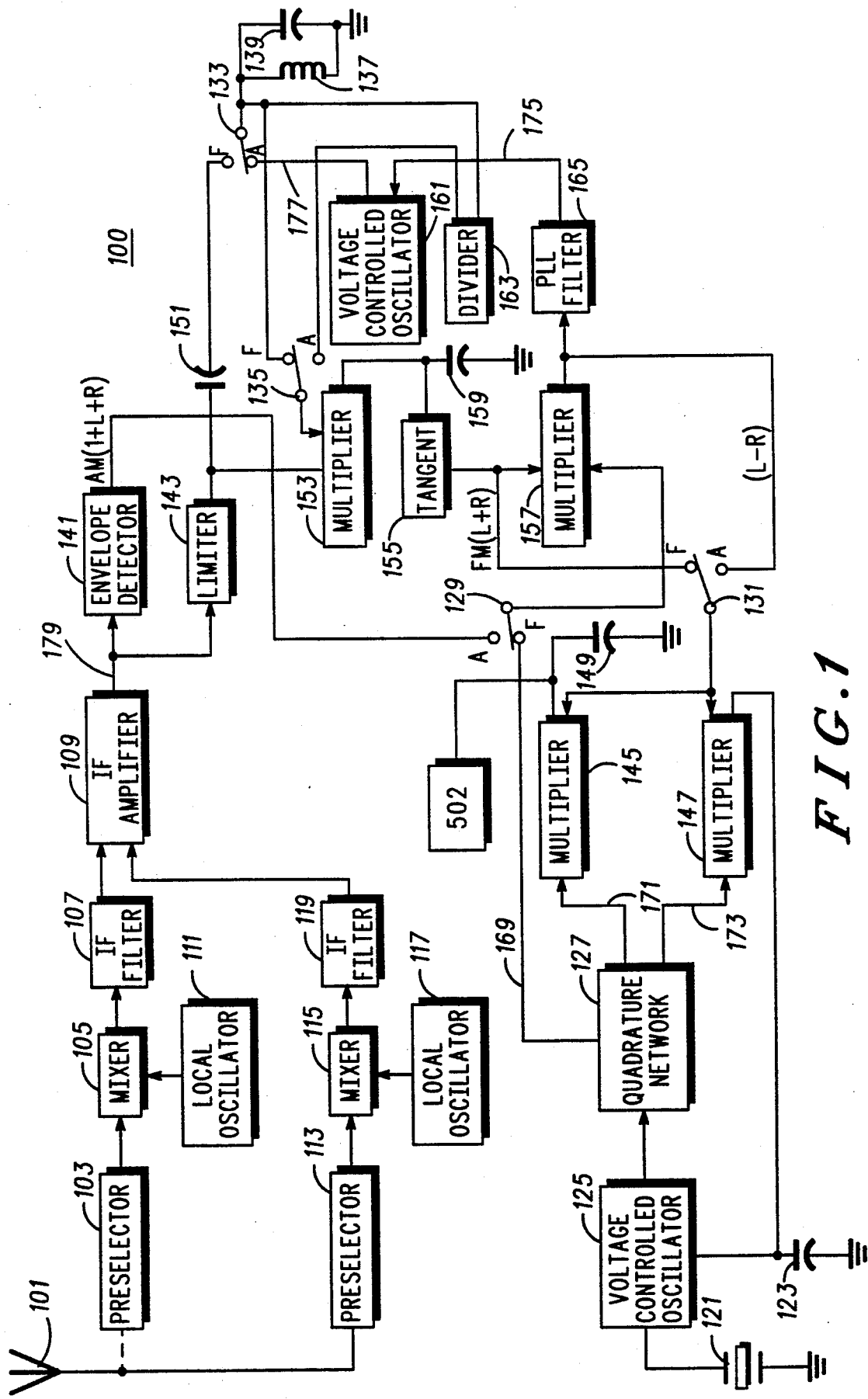
FIG. 1 is a block diagram that shows a first embodiment of an AM-FM combined stereo receiver 100, according to the invention.

FIG. 1 is a block diagram that shows a first embodiment of an AM-FM combined stereo receiver 100, according to the invention.

Referring now to FIG. 1, there is shown the circuit flow structure from the antenna input 101 to the L+R and L−R outputs. Much of this circuitry is described in some detail in other patent applications that will be cited. The RF front end, which includes the preselector, mixer and local oscillator (LO) is similar to most low voltage combined AM/FM stereo IC's (see, for instance, Block diagram TA8122').

For AM Stereo the expected input signal is of the form A* cos (w$_c$t+$\phi$), where A=(1+Left+Right) and $\phi$=tan$^{-1}$[(L−R)/(1+L+R)]. This signal is propagated in the AM broadcast band which spectrally extends from 520 kHz to 1710 kHz. The antenna 101 receives the electromagnetic wave and converts it into an AC voltage and current. This current is applied to the input of the preselector 103. The preselector is a radio frequency filtering circuit which partially removes signals other than the desired station (A* cos (w$_c$t+$\phi$)). This circuit is typically composed of one or two resonant circuits, which are constructed of inductors and tunable capacitors or varactors. In a home or portable receiver, the AM and FM antennas are often separate. In these receivers the AM antenna is generally a coil with a large ferrite or powdered iron core though it and is tuned with the variable capacitor. This antenna, referred to as a 'loop stick', performs the function of antenna and preselector in the same circuit. The preselected signal is then supplied to the mixer circuit 105. The mixer can be described as a circuit that multiplies the preselected RF with a reference signal supplied by the local oscillator 111. Mixing in the time domain is equivalent to adding and subtracting in the frequency domain. Therefore the output frequency from the mixer 105 is the absolute value of the preselected RF signal minus the local oscillator frequency. This is generally written as |{Carrier Frequency−Local Oscillator frequency}| =Intermediate Frequency (e.g., IF). The local oscillator 111 is designed such that when it is at the desired frequency, which when mixed with the preselected RF produces the desired IF, that the RF carrier is at the center frequency of the preselector filtering. This is generally defined in the industry as being 'tracked'. The above approach is described as a superheterodyne receiver. The IF signal is then further filtered to eliminate other interfering signals by the IF filter 107.

For FM stereo the expected input is also of the form $A * \cos(w_c t + \phi)$. However in this case the $\phi$ term is a frequency deviation of the baseband term shown in FIG. 2A.

Figure 2A:
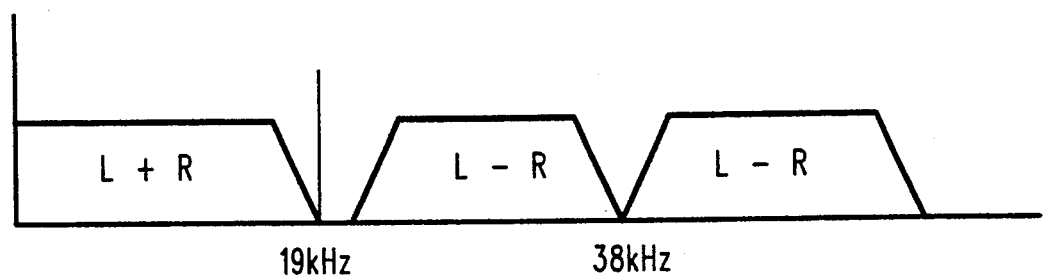
FIG. 2A is a first spectrum diagram.

Referring now to FIG. 2A, this baseband signal has the Left+Right (L+R) signal described as normal monophonic audio. The Left-Right signal is a double sideband suppressed carrier signal (DSBSC) where the suppressed carrier is at 38 kHz. A pilot tone is added at 19 kHz, that is phase coherent with the suppressed carrier (38 kHz) term, such that it can be used to derive a reference signal in the FM Stereo decoder. This signal will be necessary to translate the L−R signal to 0 Hz (D.C.) which is necessary to develop the correct stereo output. The baseband FM Stereo signal modulates the carrier such that the peak carrier deviation is 75 kHz.

The FM antenna is generally a whip (e.g., straight piece of wire) or a home roof mounted antenna. This circuit as with the AM receiver converts the electromagnetic wave into a voltage and current. The signal is supplied to the preselector 113, which as described for the AM receiver is made of inductors and capacitors, and partially removes signals other than the desired carrier. This preselected signal is then converted in the mixer 115 to the desired IF frequency. As with the AM section the signal is further filtered in the IF filter 119 to remove interfering signals. This is defined as a superheterodyne receiver and is well known in the industry.

Therefore, both the AM and FM signals go though relatively the same process to be converted to an IF signal 179. The major difference is that the AM RF signal is at 520 kHz to 1710 kHz and is converted to an IF of 450 kHz, whereas the FM signal is at 88 MHz to 108 MHz and is converted into a 10.7 MHz IF signal.

The output of the IF amplifier 109 is connected into the envelope detector circuit 141 along with other circuits. This block supplies both amplification and the narrow band AGC action for the radio. The gain is necessary to supply the decoder with large enough signal levels that the decoding is accurate. The AGC function is necessary to hold the output signal (179) at the desired level. The envelope detector 141 performs the function of multiplying the IF signal 179, $A * \cos(w_i t + \phi)$ by the limited form of $A * \cos(w_i t + \phi)$ or sgn $\{\cos(w_i t + \phi)\}$, where sgn is the signum function. This multiplication can be written as $A * \cos(w_i t + \phi) *$ sgn $\{\cos(w_i t + \phi)\}$, which results in $(A/2) + (A * \cos(2(w_i t + \phi))/2)$. Any scaling of the A term in the demodulation process is ignored for convenience. The $(A/2) * \cos(2(w_i t + \phi))$ term is removed by an audio lowpass filter and only the A/2 term is left. In the AM mode the A term is 1+Left+Right. In the FM mode 'A' is the envelope multipath term and could, in high performance receivers, be used as an indication of the signal quality.

As shown in FIG. 1, the first embodiment includes the limiter 143, multiplier 153 and resonant circuit 137, 139 which form a discriminator circuit for the FM mode. In the AM mode the voltage controlled oscillator (VCO) 161 is added along with a divider 163 to form a phase locked loop (PLL). Both of these circuits are used to extract the $\phi$ term from the IF signal 179 ($A * \cos(w_c t + \phi)$). The reason two different circuit configurations are used is that when $\phi$ is in the form of phase modulation as for AM stereo, a PLL is generally the desired decoding approach, however if the $\phi$ term is in the form of a frequency deviation as with FM stereo, a limiter discriminator approach may be more desirable. Other configurations may have a PLL detection for both AM and FM or a discriminator detecting both AM and FM.

For the FM configuration, switches 129, 131, 133 and 135 are both all set to the position designated F. To achieve the AM configuration, the same switches are set to the position designated A.

In the AM configuration, $A * \cos(w_i t + \phi)$ is supplied to the input of the limiter 143. The limiter as explained previously removes the amplitude modulation (A). This circuit is similar in function to the generic part MC1355. Therefore the output from the limiter 143, supplied to the multiplier 153, is sgn $\{\cos(w_i t + \phi)\}$, where sgn is the signum function. This multiplier circuit 153 is similar to the generic part MC1596.

The voltage controlled oscillator 161 operates at a center frequency partially controlled by the resonant frequency of the inductor and capacitor 137, 139. The VCO steering voltage 175 is supplied by the output of the PLL filter 165. This voltage 175 causes a small variation in the operating frequency of the oscillator, which ideally is linearly proportional to the difference between the nominal reference voltage (VCO control voltage at center frequency) minus the PLL filter voltage. This VCO is similar to the FM oscillator of the oscillator/modulator section of the Motorola part MC1376. Writing the frequency to voltage relationship for the ideal VCO results in an equation of the form of $F_{out} = \{(V_{ref} - V_{pll}) * k\} + F_{ref}$, where k=VCO gain per volt, Vref is the control voltage of the VCO when it is defined as free running and Vpll is the voltage at 175. The output 177 of the VCO 161, which is present on the resonant circuit 137, 139, is supplied to the digital divider 163.

For the convenience of using the same resonant circuit 137, 139 with the FM detector, a resonant frequency of 10.8 MHz is chosen for AM. The divider 163 is set to divide the frequency of the VCO signal 177 by 24. Therefore the incoming signal, which is at 10.8 MHz, is divided by 24 and the outgoing signal is at 450 kHz, and $w_{vco}$ will be defined as $2 * \pi * Fvco$ (450 kHz). Both the limiter 143 output sgn $\{\cos(w_i t + \phi)\}$ and the divider 163 output sgn $\{\cos(w_{vco} t)\}$ are supplied to the multiplier 153. The output of the multiplier 153 is therefore $\{(w_i t + \phi) + (w_{vco} t)\}/2 + \{(w_i t + \phi) - (w_{vco} t)\}/2$. This output signal is then filtered in the capacitor 159 shown attached to the multiplier 153. Since $w_{vco}$ and $w_i$ are significantly higher in frequency than audio and approximately the same frequency, the filter 159 can easily remove the $(w_i t + w_{vco} t)$ term. This results in $\{(w_i t + \phi) - (w_{vco} t)\}$ being the output of the multiplier 153. Circuitry in the tangent generator 155 and mulitplier 157, which will be described later, converts $(w_i t + \phi - w_{vco} t)$ into $(A)^* \tan\{(w_i t + \phi) - (w_{vco} t)\}$. This signal is supplied to the PLL filter 165 to control the frequency of the VCO 161.

Under normal operating conditions the PLL is defined as locked. In this case $w_i t = w_{vco} t$ and the output of multiplier (153) reduces to $\phi$. The action of the PLL is described in detail by Viterbi and others in well-known references. The particular action of the tangent PLL is described in Lawrence M. Ecklund, "Automatic IF Tangent Lock Control Circuit," U.S. Pat. No. 4,872,207, issued Oct. 3, 1989, which patent is hereby incorporated by reference.

Assuming now that switches 129, 131, 133 and 135 are set to designated F, the circuit is set to the FM configuration. For the FM stereo transmission system the signal 179 supplied to the limiter 143 can be defined as $A^* \cos\{w_i t + 2\pi f_d \int m(t) d(t)\}$, where m(t) is the modulation and $f_d$ is the frequency deviation constant. The exact details of FM demodulation in a limiter discriminated approach as shown above is well described in communication texts such as the ITT Reference Data handbook for Radio Engineers or Principles of Communications by Ziemer and Tranter. This circuit can be implemented using a CA3089.

Heuristically the FM modulation can be described as moving the center frequency of the carrier by the amplitude of the modulation. Therefore, for FM stereo, the signal can be described as the baseband signal shown in FIG. 2A. Included is the L+R signal in the 0 to 15 kHz region and the L−R signal which is a double sideband suppressed carrier signal (DSBSC) where the suppressed carrier is at 38 kHz, while the pilot tone is at 19 kHz. This baseband signal is used to change the frequency of the carrier, where each instantaneous amplitude of the baseband can map into an instantaneous deviation of the carrier frequency.

The limiter 143 removes any AM modulation which may have been accidently induced in the propagation channel. The limiter 143 also turns the carrier sine wave into a square wave, e.g., sgn. $(\cos(w_i t + \phi))$. This signal is supplied to both the resonant circuit 137, 139 and the multiplier 153. The phase response vs. carrier frequency characteristic of the resonant circuit 137, 139 is $\tan^{-1}$ ((freq(instantaneous)−freq. (average))/freq. (bandwidth/2))+90°. The resultant multiplication in multiplier (153) has the limited incoming IF signal sgn. $\{\cos(w_i t + \phi)\}^*$ sgn. $(\sin(w_i t + \phi + (\phi 1)))$, which results in $\phi 1$ after filtering, where $\phi 1$ is the $\tan^{-1}$ (freq (instantaneous)−freq. (average))/freq. (bandwidth/2)). This recovered signal is $\tan^{-1}$ (of $K_1$ * the transmitted baseband signal), where $K_1$ is the discriminator conversion gain. As long as the bandwidth of the resonant circuit 137, 139 is wide and the corresponding phase deviation due to the resonant circuit 137, 139 is low then $\tan^{-1}(K_1^* \phi)$ can be described as $K_1^* \phi$.

To accomplish the transition between the AM($\phi$) detector and the FM($\phi$) detector switches 129, 131, 133 and 135, VCO 161 and divider 163 are provided. Switch 133 connects to the resonant circuit 137, 139 and connects either the VCO 161 to drive this circuit for the PLL approach or it connects the limiter 143 through a phase shifting capacitor 151 to drive the discriminator circuit. Switch 135 connects the multiplier 153 alternate port to either the divider 163 for the AM PLL or directly to the resonant network 137, 139 for the limiter discriminator FM approach. By switching the discriminator coupling capacitor 151 and therefore removing it from the circuit for the PLL mode, where the oscillator operates at 10.8 MHz, and switching it into the circuit for the 10.7 MHz operation, of the limiter discriminator used in FM, the shifting of the resonant circuit 137, 139 to 100 kHz lower in frequency for FM can by be easily accomplished by the specific choice of capacitor value. It is conceivable that in some applications a PLL decoder would be desired for FM along with AM. In this situation switch 133 would not be needed. Therefore in this case switch 135 would be selecting whether the PLL would be operating at 10.7 MHz or 450 kHz.

The tangent function block 155 is necessary to correctly decode both the AM and FM signals. As discussed above the output of the FM discriminator is the $\tan^{-1}\{K_1^*$ the transmitted baseband signal$\}$. Therefore, to perfectly recover the $\{K_1^*$ transmitted baseband signal$\}$ the $\tan^{-1}$ function must be removed. This can easily be done by passing the signal through a tangent function block 155. Mathematically this is described as $\tan\{\tan^{-1} (K_1^*$ transmitted baseband signal)$\} = \{K_1^*$ transmitted baseband signal$\}$.

For AM as described earlier the $\phi$ term is $= \tan^{-1}((L-R)/(1+L+R))$. To remove the $\tan^{-1}$ function it is necessary to pass the AM $\phi$ term through the tangent function 155 resulting in $\{(L-R)/(1+L+R)\}$. This approach is described in Norman W. Parker, et al., "AM Stereophonic Receiver," U.S. Pat. No. 4,172,966, issued Oct. 30, 1979, which patent is hereby incorporated by reference.

The tangent function generator 155 can be built using many different approaches. One approach using a precision piecewise linear construction is described in Charles J. Marik, "Tangent Function Generator For AM Stereo", U.S. Pat. No. 4,278,839, issued Jul. 14, 1981, which patent is hereby incorporated by reference.

At the output of the tangent function block 155 the FM signal should be an exact replica of the transmitter baseband signal as shown in FIG. 2A.

Referring now to FIG. 2A, this signal has the L+R audio in the correct form, in other words the L+R DC term is at 0 Hz. Therefore, this signal can be used directly to supply the L+R term for the matrix. To derive the L−R component for the matrix the double sideband suppressed carrier signal must be converted around DC. Conceptually, and ignoring any scaling factors, this requires multiplying the signal $\{(L-R)^* \cos(wt)\}$, where $w = 2\pi^*$ 38 kHz, by cos (wt). Therefore, $\{(L-R)^* \cos(wt)^* \cos(wt)\} = \{(L-R)/2\}^* \cos(0) + \{(L-R)/2\}^* \cos(2 wt)$. Since the 2wjt term is at 76 kHz, it is generally not a concern. The 38 kHz multiplying signal is derived in the pilot tone detector and will be discussed later. This signal is supplied to the decoder multiplier (157) along with the linearized baseband signal. The resulting spectrum out of (157) is shown in FIG. 2B.

Figure 2B:
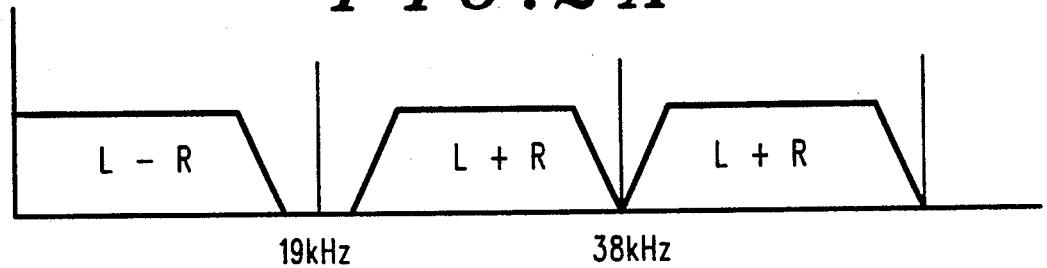
FIG. 2B is a second spectrum diagram.

Referring still to FIG. 2B, it will be appreciated that, as expected, the L−R term is referenced at DC and can therefore be used to supply the audio matrix (not show). The 19 kHz pilot tone is multiplied by 38 kHz producing two new signals one at 19 kHz and the other at 57 kHz. The L+R signal which was at baseband has been multiplied by the 38 kHz carrier and becomes a 38 kHz double sideband suppressed carrier signal.

In the AM mode the multiplier 157 is delivered $(L-R)/(1+L+R)$ from the tangent block 155. To convert this signal to $L-R$ the term must be multiplied by $1+L+R$, which is the envelope detector output in the AM mode. Therefore, for AM Stereo the switched port of the decoder multiplier (157) is set to receive the envelope output. The resulting calculation is $\{(L-R)/(1+L+R)\}*(1+L+R)=(L-R)$. This $L-R$ can then be supplied to the matrix for conversion into stereo. The $L+R$ term to the matrix (not shown) is supplied from the envelope detector 141.

Whereas the previous multipliers used in the radio could be of the MC1596 chopper type, since an IF signal was being multiplied against an IF signal, in the present multiplication it is two baseband audio signals that are being multiplied. Therefore the multiplier 157 must be of a type possibly similar to a MC1595.

The pilot tone detector for both the AM and FM signals consists of, the I multiplier (145), the Q multiplier (147), the quadrature generator (127), the VCO (125), I filter capacitor (149), loop filter capacitor (123) and threshold detector 502. This is shown in FIG. 1. The pilot tone detector structure is similar to that of a LM567C tone decoder or the decoder described in Lawrence M. Ecklund, "Tone Detector with Pseudo Phase Locked Loop," U.S. Pat. No. 4,618,981, issued Oct. 21, 1986, which patent is hereby incorporated by reference. The structure of the tone decoder can be basically divided into two parts. The first part includes the Q detector (147), VCO (125), loop filter (123) and quadrature generator (127). This section is used to determine the exact phase of the incoming pilot signal and in the FM mode it also develops a 38 kHz reference signal that is phase coherent with the suppressed 38 kHz reference signal. The second part of the detector includes the I multiplier (145), I filter (149), quadrature network (127), VCO (125) and threshold detector 502. When a pilot tone is present and the decoder is "locked", the I detector develops a DC voltage which corresponds to the amplitude of the pilot tone. When this voltage reaches a preset level it triggers the threshold detector (502) which indicates to the user, through some interface device, that the station is in stereo.

In the particular case of AM stereo the pilot tone is at 25 Hz and is present in the $L-R$ signal at the output of the decoder multiplier (157). This pilot tone is present with all the other $L-R$ audio information and is at a value of 5% with respect to the maximum $L-R$ information. The signal is supplied to one port of multiplier (147) and multiplier (145). When the decoder is 'locked' the other port in the Q multiplier is supplied by $\sin(2\pi* 25t)$. Therefore the resulting output of the multiplier is $[\{L-R\}+0.05* \cos(2\pi* 25t+\phi)]* \sin(2\pi* 25t)=(L-R)* \sin(2\pi* 25t+\phi)+0.025* \sin(0+\phi)+0.025* \sin(2*(2\pi* 25t+\phi))$. It is assumed that the first and the third terms have only high frequency energy as compared with the desired second term and if filtered by the capacitor (123) can be ignored. The second term is 0 in the locked state since $\phi$ is assumed to be equal to 0. This loop performs as a PLL, the behavior of, which is well know in the industry.

The VCO frequency for the pilot tone VCO (125) is defined the same way as the AM decoder VCO (161) e.g. Fout$=\{(V_{ref}-V_{pll})* k\}+$Fref, where k=VCO gain per volt, Vref is the tuning voltage at the oscillator free running frequency and Vpll is the voltage on capacitor (123). The VCO is to be used for FM stereo where the pilot frequency is 19 kHz and a phase accurate 38 kHz signal must be generated. Further the same VCO is used for AM Stereo where the frequency of the pilot is 25 Hz. One relatively easy way to accommodate this delta in frequency is to place a digital divider circuit between the VCO (125) and the Quadrature generator (127). This is shown in attached FIG. 4. Typically the VCO (125) frequency for FM is 76 kHz and the quadrature generator (127) is a $\div 4$ circuit. The quadrature network is formed of three divide by 2 circuits shown in FIG. 3 and will be discussed in the FM section later. Returning to FIG. 4 in the FM mode the VCO (125) is connected directly through the switch 3 to the quadrature generator (127) and the output frequency to the multipliers is 76 kHz$\div 4$ or 19 kHz. For the AM mode the frequency into the quadrature generator is 100 Hz to supply the 25 Hz reference signal to the multipliers. Therefore, the divide number for divider 2 is 760. This divider is similar to MC14024, but requiring 11 divider stages to generate division by 760.

A second form of the VCO which is more practical for some applications is shown in FIG. 5. In this case a dual PLL is used and the VCO's could have an operation similar to a LM565. The main reason for this approach is to avoid the external resonant element (121) shown in FIG. 1, develop a DC voltage that corresponds to a given VCO frequency and also reducing any spurious signals that the resonant element may produce in the broadcast band. In this approach the first PLL 402 is used to derive the correct nominal Vpll voltage for VCO (125). The resistive and capacitive elements to form 406 and 121 are constructed on the decoder IC. In Integrated Circuits the absolute value of components is poor, but the matching between similar components is very good. Therefore, the voltage 'Vpll' 403 which will give the VCO in PLL (402) of FIG. 5 a frequency F, will also give the VCO (125) frequency F, provided that the resonator elements (121) are constructed on the same die with that of 406. Given this phenomena, and that 402 frequency locks and conditions (removes the modulation) of the output of 404, the VCO (125) has the same free running frequency as the output of 404. Therefore, this processing could use the output of the limiter (143), resonant element (137, 139) or the decoder divider (163) divided by 404 to supply the desired VCO (125) nominal operating frequency.

A possible variation of this approach is to scale the resistive and capacitive elements of (121) and 406 that set the center frequency of the two VCO's. Since, the ratio of the IC elements is good, the frequency setting resistor and capacitor (121) of the second VCO can be made larger than the first VCO thus lowering the frequency of the second VCO, minimizing the number of divider sections needed in 404.

FIG. 6 shows a detailed picture of the pilot indicator circuit. Actual indication of the pilot tone comes from the I detector (145). The circuit has a $\cos(2\pi* 25t)$ reference signal (171) supplied from the quadrature generator of the pilot tone PLL. The other signal supplied to the I detector is $L-R$, which as previously stated contains $(0.05)* \cos(2\pi* 25t)$ for AM stereo. The resulting output of the multiplier is $0.025* \cos(0)=0.025$ and the high frequency terms. This multiplier output is filtered by the capacitor (149) and compared with a reference threshold 'VBB' as shown. If the size of the signal is large enough to exceed the pilot tone level reference level 'VBB' then the output of the threshold detector goes high indicating a stereo station is present.

Figure 4:
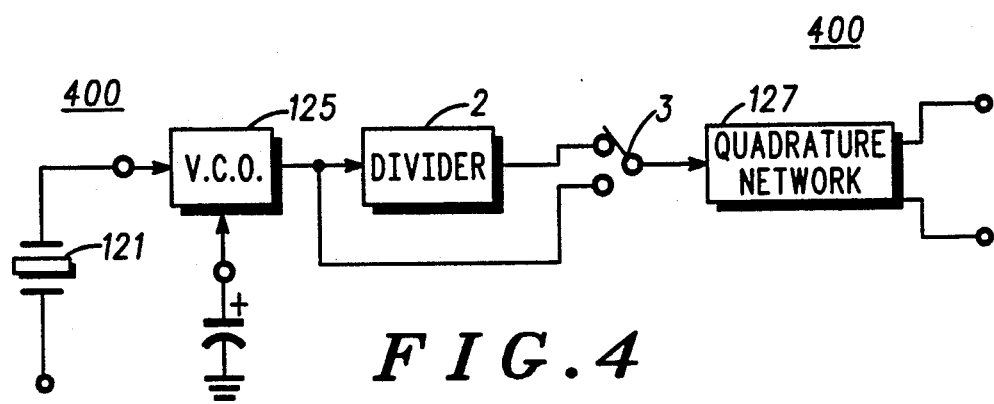
FIG. 4 is an expanded block diagram of the pilot tone VCO and quadrature network.

Returning to FIG. 1 and the FM pilot tone detector. The 19 kHz composite baseband signal including the FM pilot tone is supplied to the pilot tone I and Q multipliers 145, 147 from the output of the tangent linearizing circuit 155. As with the AM approach the pilot tone detector can be separated into two major components. Also as before these components are the PLL pilot tone extraction system and the actual detection of the pilot tone level. There are some gain and level changes that are necessary in the PLL depending upon the K1 term in the discriminator. Assuming that the output gain of the tangent function 155 is switched so that 100% AM modulation is the same as 100% FM modulation. Then the only changes necessary are to switch out the divider 163, as shown in FIG. 4 and change the value of VBB to 9/5 higher to account for the 9% FM pilot level versus the 5% pilot level for AM stereo.

Figure 3:
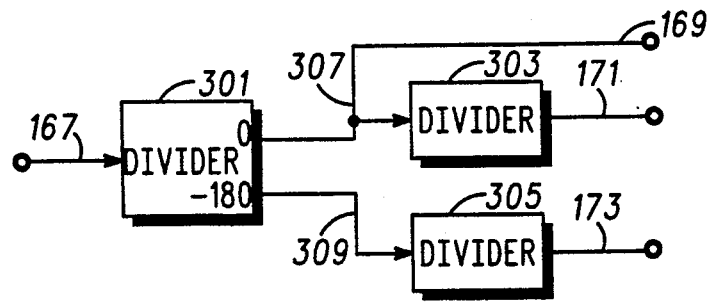
FIG. 3 is a block diagram for a quadrature network according to the invention.

The structure of the quadrature generator 127, which is similar to that of the MC1310, is shown in FIG. 3. As shown therein, the 76 kHz input 167 is supplied to the input of the first divider 301 and is divided by 2. This divider has two outputs 207, 309 at 38 kHz which are 180° out of phase with each other. The 0° output 307 is supplied as the (38 kHz) drive signal 169 to the FM stereo decoder. This output 307 is also supplied to another ÷2 circuit 303 whose output supplies the I pilot tone multiplier 145. The −180° output supplies another ÷2 circuit 305 whose output supplies the reference signal 173 for the Q pilot tone multiplier 147. This technique is well known.

While various embodiments of an AM-FM Combined Stereo Receiver, according to the present invention, have been described herein above, the scope of the invention is defined by the following claims.

What is claimed is:

1. A radio for receiving, in an FM mode, FM stereo signals based on frequency deviation modulation, and for receiving, in an AM mode, AM stereo signals based on phase deviation modulation, and having a single discriminator circuit including an oscillator (161), an AM stereo circuit path for detecting phase deviation signals, an FM stereo circuit path for detecting frequency deviation signals, and a tank circuit (137, 139), the tank circuit having a first tuned frequency for the FM mode and a second tuned frequency for the AM mode, wherein, in the FM mode, the single discriminator circuit is arranged to convert the frequency deviation modulation to baseband audio, and in the AM mode, the single discriminator circuit is arranged to center frequency translate the phase deviation modulation from the IF to zero (0) Hz as the frequency-determining element for the oscillator, the oscillator being used to translate the IF signal to baseband.

2. The radio of claim 1 wherein said discriminator tank circuit (137, 139) includes means (133, 135) for switching between the AM stereo circuit path and the FM circuit path.

3. The radio of claim 2 wherein, in said AM mode, the tank circuit second tuned frequency is processed by a divider (163) to achieve a different translation frequency that is a sub-multiple of the tank frequency.

4. The radio of claim 2 wherein said tank circuit (137, 139) comprises a ceramic resonant element having an inherent inductive (L) (137) and capacitive (C) (139) components.

5. The radio of claim 4 wherein in the AM mode, the second tuned frequency is generally 10.7 MHz, and in the FM mode, the first tuned frequency is generally 10.7 MHz, 10.8 MHz being a multiple of the standard 450 KHz AM IF, and 10.7 MHz being the FM IF.

6. The radio of claim 5 wherein the switch (133) is arranged to couple an extra capacitor (151) in series with the tank circuit (137, 139) in the FM mode.

7. The radio of claim 6 wherein said extra capacitor (151) is used as a ninety degree (90°) phase shift for the FM discriminator.

8. The radio of claim 2 wherein said tank circuit (137, 139) comprises a discrete inductive (L) coil (137) and a capacitor (C) (139).

9. The radio of claim 8 wherein in the AM mode, the second tuned frequency is generally 10.8 MHz, and in the FM mode, the first tuned frequency is generally 10.7 MHz, 10.8 MHz being a multiple of the standard 450 KHz AM IF, and 10.7 MHz being the FM IF.

10. The radio of claim 9 wherein the switch (133) is arranged to couple an extra capacitor (151) in series with the tank circuit (137, 139) in the FM mode.

11. The radio of claim 10 wherein said extra capacitor (151) is used as a ninety degree (90°) phase shift for the FM discriminator.

* * * * *

UNITED STATES PATENT AND TRADEMARK OFFICE
CERTIFICATE OF CORRECTION

PATENT NO. : 5,109,542
DATED : April 28, 1992
INVENTOR(S) : Lawrence M. Ecklund

It is certified that error appears in the above-identified patent and that said Letters Patent is hereby corrected as shown below:

Column 10, line 22, "10.7" should be --10.8--.

In the Abstract:

Line 15, ", and" should be --and,--.

Signed and Sealed this

Twenty-fourth Day of August, 1993

Attest:

BRUCE LEHMAN

*Attesting Officer*  *Commissioner of Patents and Trademarks*